United States Patent
Lee

(10) Patent No.: US 11,646,600 B2
(45) Date of Patent: May 9, 2023

(54) ENERGY STORAGE SYSTEM CONVERTIBLE TO UNINTERRUPTIBLE POWER SUPPLY

(71) Applicant: LG CHEM, LTD., Seoul (KR)

(72) Inventor: Seung Min Lee, Seoul (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 276 days.

(21) Appl. No.: 16/652,821

(22) PCT Filed: Jan. 7, 2019

(86) PCT No.: PCT/KR2019/000229
§ 371 (c)(1),
(2) Date: Apr. 1, 2020

(87) PCT Pub. No.: WO2019/135657
PCT Pub. Date: Jul. 11, 2019

(65) Prior Publication Data
US 2020/0235604 A1    Jul. 23, 2020

(30) Foreign Application Priority Data

Jan. 8, 2018 (KR) .................... 10-2018-0002333

(51) Int. Cl.
*H02J 9/06* (2006.01)
*G01R 31/3835* (2019.01)
*H01M 10/44* (2006.01)

(52) U.S. Cl.
CPC ............ *H02J 9/06* (2013.01); *G01R 31/3835* (2019.01); *H01M 10/443* (2013.01)

(58) Field of Classification Search
CPC .......... H02J 9/06; H02J 9/061; H02J 7/00306; H02J 7/00308–00309; H02J 7/0029; G01R 31/3835; H01M 10/443; Y02E 60/10
(Continued)

(56) References Cited

U.S. PATENT DOCUMENTS

2010/0301675 A1   12/2010   Chen et al.
2011/0133655 A1*   6/2011   Recker ................ H05B 47/13
                                                              315/159
(Continued)

FOREIGN PATENT DOCUMENTS

DE    9317741 U1    1/1994
JP    H10-164765 A   6/1998
(Continued)

OTHER PUBLICATIONS

Office Action dated Feb. 22, 2021, issued in corresponding Japanese Patent Application No. 2020-502614.
(Continued)

*Primary Examiner* — Hal Kaplan
*Assistant Examiner* — Swarna N Chowdhuri
(74) *Attorney, Agent, or Firm* — Morgan, Lewis & Bockius LLP

(57) ABSTRACT

Provided is a method for switching an energy storage system (ESS) to an uninterruptible power supply (UPS). The method includes: a normal power supply determination step of determining whether normal power is supplied to the ESS; an operation mode setting step of setting an operation mode of the ESS according to whether the normal power is supplied or not; and an ESS control step of controlling the ESS according to a reference corresponding to the operation mode.

14 Claims, 5 Drawing Sheets

(58) Field of Classification Search
USPC .......................................................... 307/66
See application file for complete search history.

(56) References Cited

U.S. PATENT DOCUMENTS

| | | | | |
|---|---|---|---|---|
| 2012/0043889 | A1* | 2/2012 | Recker ................. | H05B 45/385 |
| | | | | 315/86 |
| 2012/0319653 | A1* | 12/2012 | Kumar ................. | H02J 7/0013 |
| | | | | 320/118 |
| 2014/0333137 | A1* | 11/2014 | Lin ........................ | H02J 9/061 |
| | | | | 307/66 |
| 2015/0035359 | A1 | 2/2015 | Chung et al. | |
| 2015/0171666 | A1* | 6/2015 | Yeon ...................... | H02J 9/061 |
| | | | | 700/297 |
| 2016/0204654 | A1 | 7/2016 | Mondal et al. | |
| 2017/0126054 | A1* | 5/2017 | White ................. | H05K 7/1492 |
| 2017/0203660 | A1* | 7/2017 | He ......................... | B60L 53/12 |
| 2018/0072181 | A1* | 3/2018 | Christen ............... | B60L 58/12 |
| 2019/0052090 | A1 | 2/2019 | Kobayashi et al. | |

FOREIGN PATENT DOCUMENTS

| | | |
|---|---|---|
| JP | H11-59291 A | 3/1999 |
| JP | H11-344544 A | 12/1999 |
| JP | 2006-280145 A | 10/2006 |
| JP | 4487210 B2 | 6/2010 |
| JP | 2013-027136 A | 2/2013 |
| JP | 2015-029405 A | 2/2015 |
| KR | 1999-026367 A | 4/1999 |
| KR | 20-0363321 Y1 | 10/2004 |
| KR | 20-2014-0003317 U | 6/2014 |
| KR | 10-2015-0098120 A | 8/2015 |
| KR | 10-1598452 B1 | 2/2016 |
| KR | 10-1605475 B | 3/2016 |
| KR | 10-1663445 B1 | 10/2016 |
| KR | 10-2016-0128706 A | 11/2016 |
| KR | 10-1729273 B1 | 4/2017 |
| KR | 10-1805273 B1 | 12/2017 |
| WO | 2008/113047 A2 | 9/2008 |
| WO | 2017-163625 A1 | 2/2019 |

OTHER PUBLICATIONS

Notice of Allowance dated Jun. 13, 2022 issued by the Japanese Patent Office in corresponding Japanese Patent Application No. 2020-502614.
International Search Report issued in corresponding International Patent Application No. PCT/KR2019/000229, dated Apr. 22, 2019.
Extended European Search Report dated Jul. 9, 2020, issued in corresponding European Patent Application No. 19735962.3.

* cited by examiner

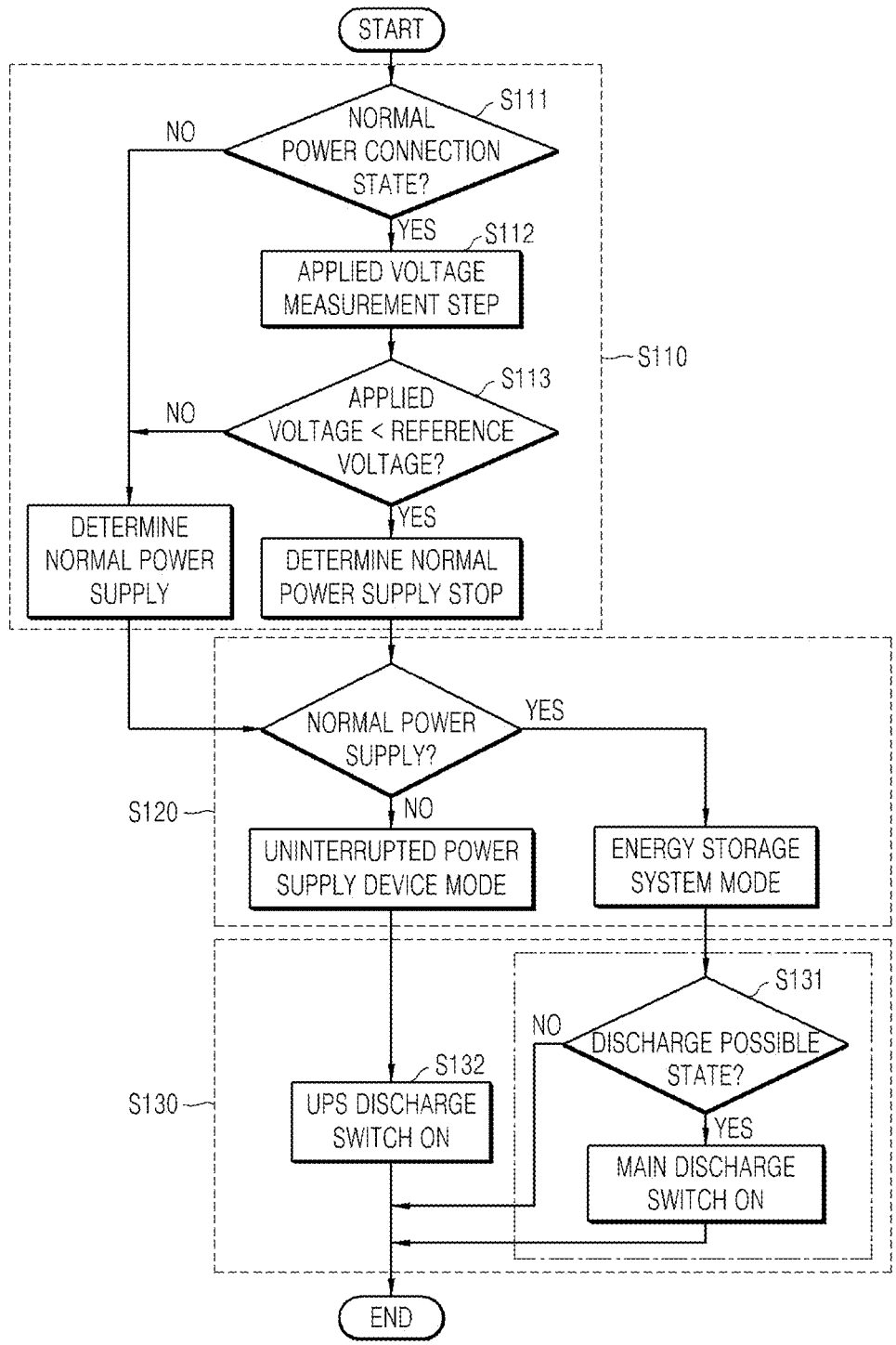
[Fig. 1]

[Fig. 2]
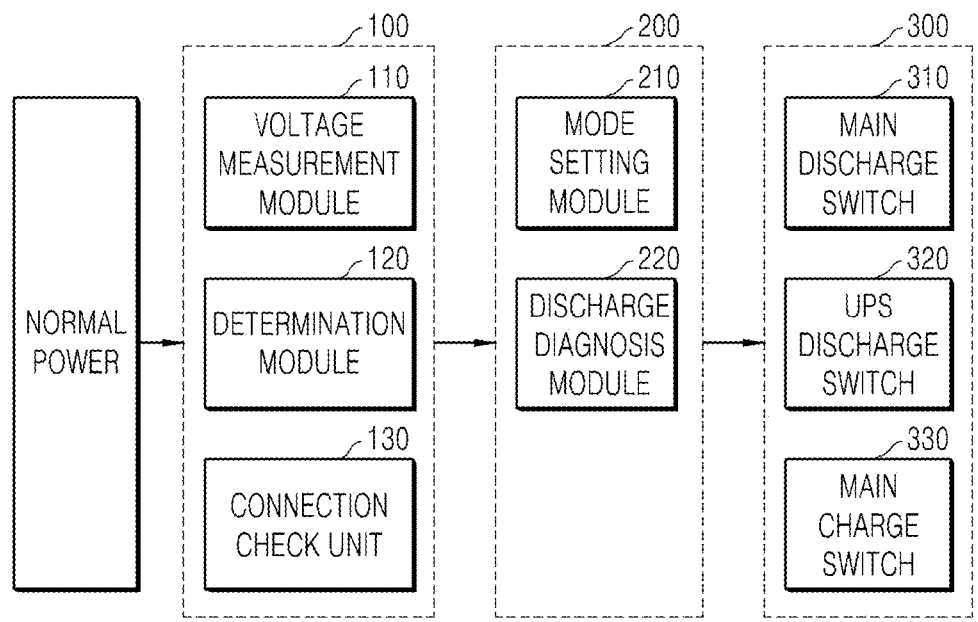

[Fig. 3]
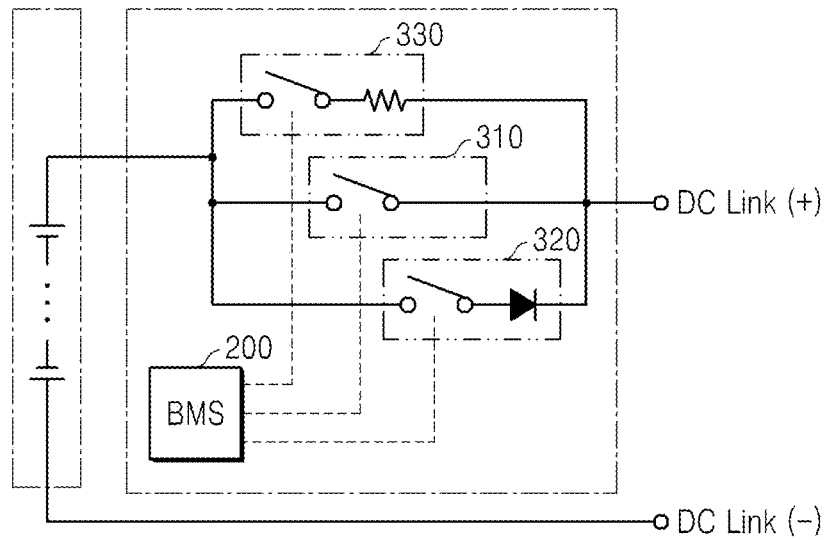
[Fig. 4]
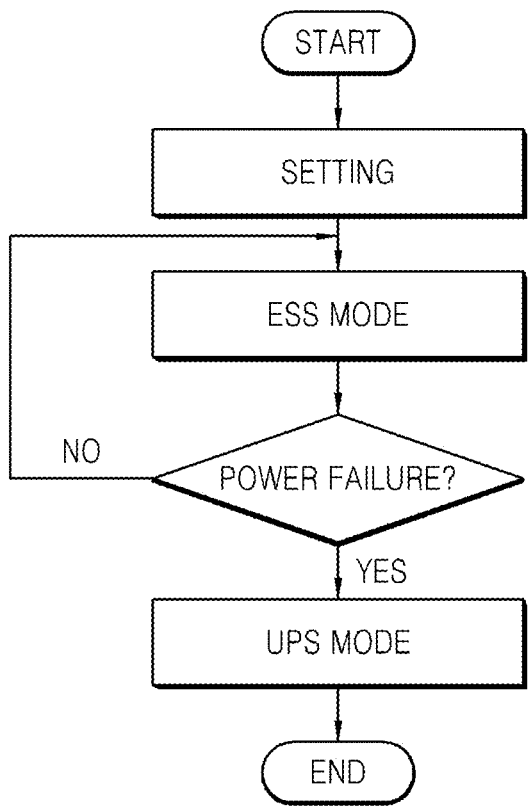

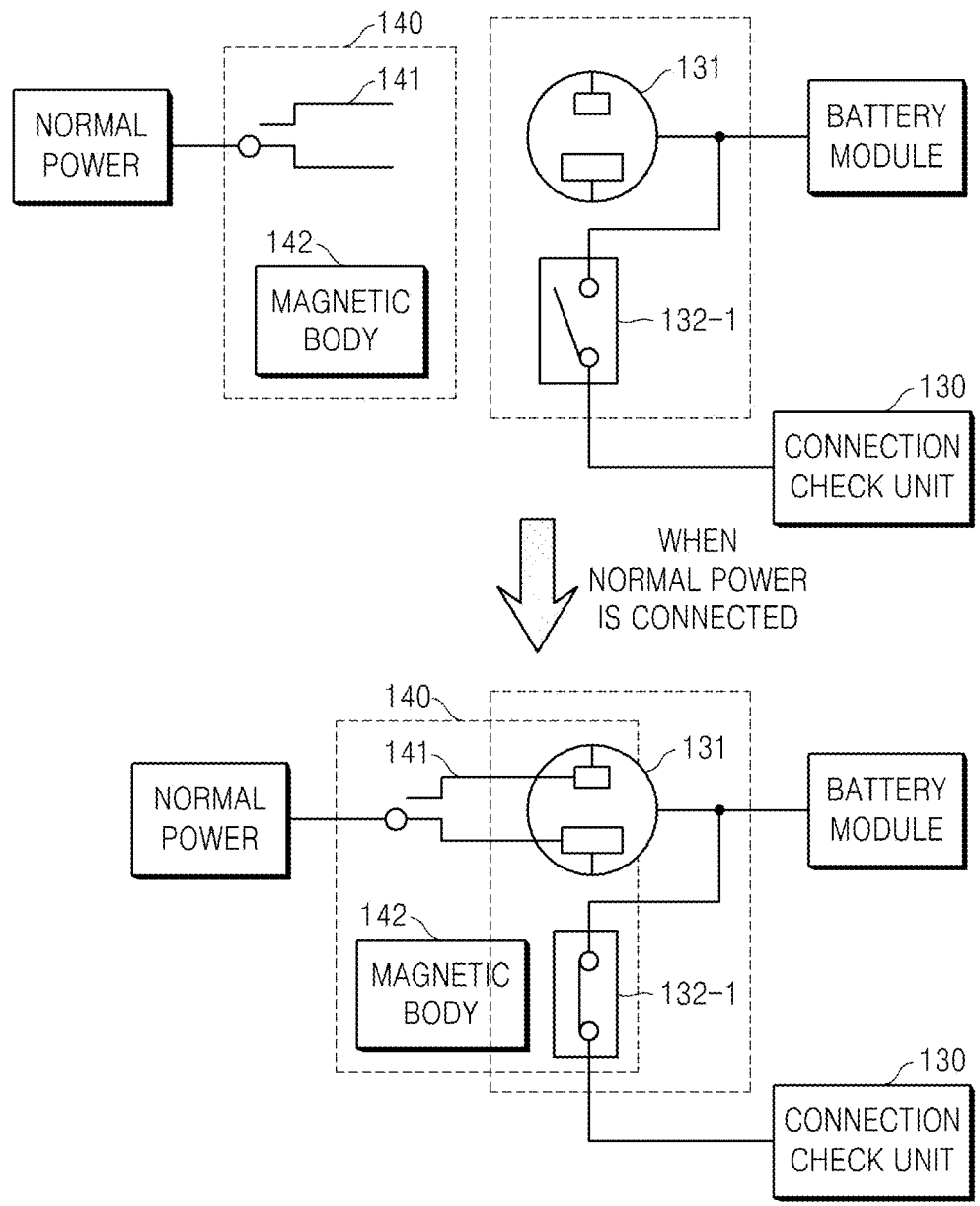

[Fig. 6]
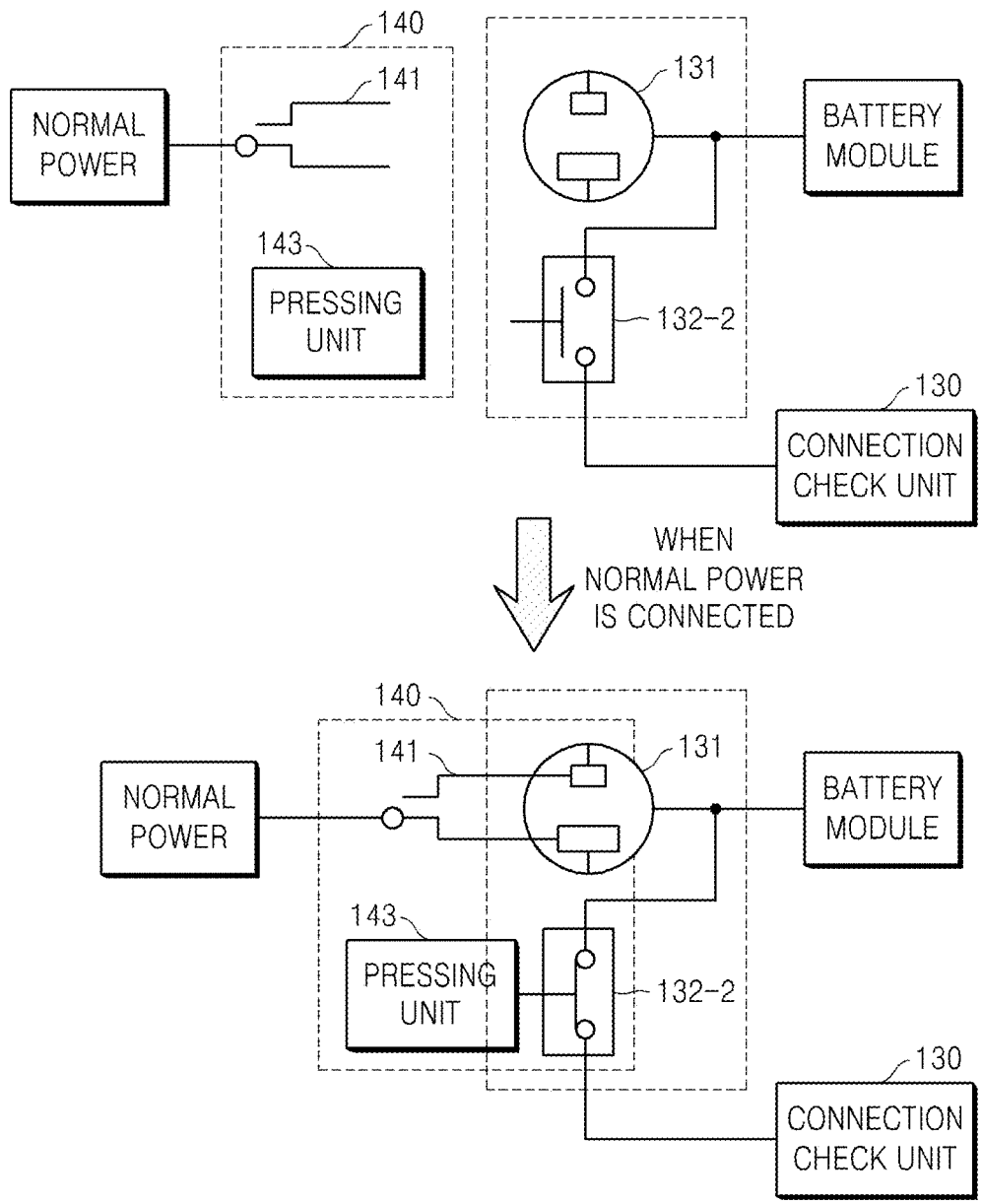

ENERGY STORAGE SYSTEM CONVERTIBLE TO UNINTERRUPTIBLE POWER SUPPLY

TECHNICAL FIELD

The present invention relates to an energy storage system that may be used by switching to an uninterruptible power supply device.

More particularly, the present invention relates to a technique for switching an energy storage system into an uninterruptible power supply device by further including a circuit for discharging by bypassing the discharge diagnosis of the energy storage system.

BACKGROUND ART

Generally, uninterruptible power supply devices are also called UPS devices, and mean systematic devices that continuously supply a normal voltage and frequency to a load device in the event of a change in the commercial power supply and generator power of the system and continuously supply and maintain the power supply for a designated time using battery power even during a power failure.

As the industry develops, these uninterruptible power supply devices are developed to reduce the loss of data and loss of information, and are increasingly used in the electric power electronic circuit field due to its increased marketability and development in the current society where the computer is mainly used. Moreover, as the wall between the uninterruptible power supply (UPS) device and the Energy Storage System (ESS) comes down, in recent years, the government allows to apply the ESS to general facilities where only the UPS device is possible, so that the form (UES, UPS+ESS) that uses the ESS as the USP device is under development.

Meanwhile, the general ESS controls the discharging of the ESS according to the charging capacity, temperature, discharge voltage, etc. of the ESS in order to prevent the ESS from being overdischarged and reducing the lifetime of the ESS.

Moreover, in order to prevent data loss, since the UPS device has the highest priority to discharge the load without the power being disconnected, it is recommended to set the discharge reference to a low value so that the discharge is maximized.

Therefore, when the ESS is used for the UPS device, the discharge reference when used as an ESS and the discharge reference when used as a UPS device must be separately managed and controlled.

A conventional technique for this is a technique to set the discharging reference of the ESS through software control according to the use purpose.

More specifically, when used for ESS use purpose, it discharges the ESS to a load based on the first criterion, and when the ESS is used for UPS device use purpose, it discharges the ESS to a load based on a second reference lower than the first criterion.

However, if the ESS is used as the UPS device through software control in such a manner, software corresponding to the discharge reference (first criterion) of the ESS and the discharge reference (second criterion) of UPS device must be developed, so that software development is time-consuming and costly. Therefore, in order to solve such a problem, the present invention proposes a device and method for minimizing software changes and switching an ESS to a UPS device through a simple switch operation.

PRIOR ART DOCUMENT

Korean Patent Publication No. 10-1605475

DISCLOSURE OF THE INVENTION

Technical Problem

The present invention relates to a device and method for switching an energy storage system to an uninterruptible power supply device, as configuring a circuit for discharging through bypassing the diagnostic circuit of the energy storage system to bypass the diagnostic circuit of the energy storage system through simple switch operation in case of power failure.

Technical Solution

Embodiments of the present invention provide a method for switching an energy storage system (ESS) to an uninterruptible power supply (UPS), the method including: a normal power supply determination step of determining whether normal power is supplied to the ESS; an operation mode setting step of setting an operation mode of the ESS according to whether the normal power is supplied or not; and an ESS control step of controlling the ESS according to a reference corresponding to the operation mode.

The normal power supply determination step includes: an applied voltage measurement step of measuring a voltage applied from the normal power; and a measurement step of determining whether a normal power is supplied by comparing a voltage applied from the normal power and a predetermined reference voltage, wherein the measurement step determines that the normal power is supplied when the voltage applied from the normal power is equal to or higher than the predetermined reference voltage, and determines that the supply of the normal power is stopped when the voltage supplied from the power is lower than the preset reference voltage.

The operation mode setting step may set the ESS to an ESS mode when it is determined that the normal power is supplied in the normal power supply determination step, and set the ESS to a UPS mode when it is determined that the supply of normal power is stopped in the normal power supply determination step.

When the ESS is set to the ESS mode, the ESS control step may perform a discharge diagnosis step of diagnosing whether discharge is possible based on a predetermined reference and a discharge by turning on a main discharge switch according to a diagnosis result of the discharge diagnosis step, and when the ESS is set to the UPS mode, perform a discharge directly by turning on a UPS discharge switch without performing the discharge diagnosis step.

The discharge diagnosis step may measure a charge capacity, a temperature, and a discharge voltage of the ESS and compares this with the predetermined reference to check whether the ESS is dischargeable.

The normal power supply determination step may further include a connection check step of checking whether the ESS and the normal power are physically connected, wherein the connection check step may determine that the normal power and the ESS are physically connected when a normal power output terminal is inserted into an insertion portion of a connection check unit and a switch of a connection check unit is on, and determine that the normal power and the ESS are not physically connected when the switch of the connection check unit is off.

In the connection check step, when the switch includes a magnetic switch that is turned on by a magnetic body, the normal power output terminal may include a magnetic body, and when the normal power output terminal is inserted into the insertion portion of the ESS, the magnetic switch may be turned on by the magnetic switch provided at the output terminal of the normal power.

In the connection check step, when the switch includes a push switch that is turned on by pressure, the output terminal of the normal power may include a pressing unit, and when the output terminal of the normal power is inserted into the insertion portion of the ESS, the push switch may be turned on by a pressing unit provided at the output terminal of the power.

In other embodiments of the present invention, an energy storage system (ESS) operable in an uninterruptible power supply (UPS) mode includes: a normal power supply check unit configured to check normal power supply; a BMS configured to control an operation mode and charging/discharging of the ESS; and a mode switching switch unit operating according to a control of the BMS.

The normal power supply check unit may include: a voltage measurement module configured to measure a voltage applied from the normal power; and a determination module configured to compare a voltage applied from the power with a predetermined reference voltage to determine whether normal power is connected; wherein the determination module may determine that the normal power is supplied when the voltage applied from the normal power is equal to or higher than the predetermined reference voltage, and determine that the supply of the normal power is stopped when the voltage applied from the power is lower than the predetermined reference voltage.

The BMS may include: a mode setting module configured to set an operation mode of the ESS; and a discharge diagnosis module configured to diagnose whether the ESS is dischargeable when the ESS is set to an ESS mode, wherein the mode setting module may set the ESS to an ESS mode when the normal power supply check unit determines that normal power is supplied, and set the ESS to a UPS mode when the normal power supply check unit determines that the supply of the normal power is stopped.

The discharge diagnosis module may measure a charge capacity, a temperature, and a discharge voltage of the ESS and compare this with the predetermined reference to check whether the ESS is dischargeable.

The mode switching switch unit may include: a main discharge switch that is turned on by receiving a discharge command from the BMS to discharge the ESS when the ESS is set to the ESS mode; and a UPS discharge switch that is turned on by receiving a UPS mode command from the BMS and operates the ESS in a UPS mode.

The UPS discharge switch may include a diode, wherein the main discharge switch and the UPS discharge switch may be connected in parallel.

The normal power supply check unit may further include a connection check unit configured to check whether the normal power is physically connected, wherein the connection check unit may include: a receiving portion into which an output terminal of normal power is inserted; and a switch that is turned on or off according to whether a normal power output terminal is inserted into the insertion portion.

The switch may include a magnetic switch that is turned on by a magnetic body, wherein the normal power output terminal may include a magnetic body at a position corresponding to the magnetic switch, wherein when the normal power output terminal is connected to the insertion portion, the magnetic switch may be turned on by the magnetic body of the normal power output terminal.

The switch may include a push switch that is turned on by pressure, wherein the normal power output terminal may include a pressing unit for applying a pressure to a position corresponding to the push switch, wherein when the normal power output terminal is connected to the insertion portion, the push switch may be turned on by the pressing unit of the normal power output terminal.

Advantageous Effects

According to the present invention, it is possible to allow both the power supply and the backup power supply with the energy storage system by switching an energy storage system into an uninterruptible power supply device.

Further, the present invention may switch an energy storage system into an uninterruptible power supply device through simple switch operation.

In addition, since the present invention does not have to develop software corresponding to a second reference for energy storage system specifications (a discharge reference when the energy storage system is used as an uninterruptible power supply), the time and cost used for software development may be reduced.

BRIEF DESCRIPTION OF THE DRAWINGS

FIG. 1 is a flowchart for illustrating a method of switching an energy storage system (ESS) according to an embodiment of the present invention to an uninterruptible power supply device (UPS).

FIG. 2 is a configuration diagram of an energy storage system operable in an uninterruptible power supply device mode according to an embodiment of the present invention.

FIG. 3 is a circuit diagram of an energy storage system operable in an uninterruptible power supply device mode according to an embodiment of the present invention.

FIG. 4 is a view of a technique in which a conventional energy storage system is used as an uninterruptible power supply device.

FIG. 5 is a configuration diagram of configuring as a magnetic switch a switch of an energy storage system operable in an uninterruptible power supply device mode according to an embodiment of the present invention.

FIG. 6 is a configuration diagram of configuring as a push switch a switch of an energy storage system operable in an uninterruptible power supply device mode according to an embodiment of the present invention.

MODE FOR CARRYING OUT THE INVENTION

Hereinafter, embodiments of the present invention will be described in detail with reference to the accompanying drawings so that those skilled in the art may easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "initial," "second," etc., may be used herein to describe various elements, these elements should not be limited by these terms. The above terms are used only to distinguish one component from another. For example, an initial component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

The present invention relates to a device and method for using an energy storage system for both energy storage system use and uninterruptible power supply device use.

More specifically, instead of using an energy storage system as an uninterruptible power supply device by changing the discharge reference through software control during a power outage, proposed are a device and method for switching an energy storage system into an uninterruptible power supply device through simple switch operation. FIG. 4 is a view of a technique (Korean Patent Registration No. KR 10-1605475) in which a conventional energy storage system is used as an uninterruptible power supply device.

Referring to FIG. 4, in relation to a method of using a conventional energy storage system as an uninterruptible power supply device, there is a technique through which in the energy storage system mode, the usable capacity is set lower than the rated capacity (first criterion) to increase the available capacity during power failure, and in the uninterruptible power mode, the usable capacity is set higher than the rated capacity (second criterion) to supply power to a load during power failure.

However, since such a conventional technique requires software to be separately designed according to the first and second criteria of the control software, software design is time-consuming and costly. In addition, the first and second criteria have a problem in that separate software needs to be designed for each specification of the energy storage system.

Further, since it is necessary to continuously check whether the first reference and the second reference are satisfied, there is a disadvantage that the system process is frequently used.

Unlike this, according to the present invention, instead of setting the first reference and the second criterion, when it is determined that a power failure occurs, the energy storage system may be used as an uninterruptible power supply device through a simple mode switching circuit.

1. Method For Switching Energy Storage System (ESS) According To Embodiment Of Present Invention To Uninterruptible Power Supply Device (UPS)

FIG. 1 is a flowchart for illustrating a method of switching an energy storage system (ESS) according to an embodiment of the present invention to an uninterruptible power supply device (UPS).

Hereinafter, referring to FIG. 1, a method of switching an energy storage system (ESS) according to an embodiment of the present invention to an uninterruptible power supply device (UPS) will be described.

1-1. Normal Power Supply Determination Step S110

A method of switching an energy storage system (ESS) according to an exemplary embodiment of the present invention to an uninterruptible power supply device (UPS) may be started from a normal power supply determination step S110 for determining whether a normal power supply is provided.

A method of switching an energy storage system (ESS) according to an embodiment of the present invention to an uninterruptible power supply device (UPS) switches an energy storage system to an uninterruptible power supply device only during a power failure. The reason for this is as follows.

Since the ESS discharges only when the charging capacity, temperature, discharge voltage, etc. of the ESS satisfy a predetermined discharge criterion, when the predetermined discharge reference is not satisfied at the time of power failure, the load connected to the ESS may be cut off such that the data stored in the load may be lost or the load may be damaged. Therefore, in order to supply power to the load without interruption when a power failure occurs, the ESS is switched to operate as a UPS. On the other hand, if the UPS is continuously used even when power is not supplied (even when power is always supplied), since the UPS continues to charge to maintain full charge, the lifetime of the ESS may be shortened.

For the above reason, the ESS with both the functions of the ESS and the function of the UPS is switched to the UPS only during power failure. Therefore, when the power is always supplied again, the ESS switched to a UPS is switched to operate as the ESS.

On the other hand, the normal power supply determination step S110 is configured including a voltage measurement step S112 of measuring a voltage applied from the normal power and a determination step S113 of determining whether the normal power is connected by comparing the voltage applied from the normal power with a predetermined reference voltage. Meanwhile, the measurement step S113 may determine that the normal power is supplied when the voltage applied from the normal power is equal to or higher than the predetermined reference voltage, and determine the normal power supply is stopped when the voltage applied from the power is less than the predetermined reference voltage.

Meanwhile, the normal power supply determination step S110 may further include a connection check step S111 for checking whether the ESS and the normal power are physically connected.

More specifically, the connection check step S111 may determine that the normal power and the ESS are physically connected when the connection check unit of the ESS is switched on, and determine that the normal power and the ESS are not physically connected when the connection check unit is switched off.

For example, the connection check step S111 may determine that normal power is connected when the output terminal of the normal power provided with the magnetic body is inserted into the insertion portion of the connection check unit and the magnetic switch provided in the connection check unit is turned on by the magnetic body provided at the output terminal of the normal power. Specifically, when the normal power output terminal provided with the magnetic body is inserted into the receiving portion of the connection check unit, the magnetic body provided in the normal power output terminal and the magnetic switch are close to each other so that the magnetic switch may be turned on. As another example, the connection check step S111 may determine that normal power is connected when it is configured including a push switch and the output terminal of the normal power equipped with the pressing unit is inserted into the receiving portion of the connection check unit so that the push switch provided in the connection check unit is turned on by the pressing unit provided at the output terminal.

Specifically, when the normal power output terminal provided with the pressing unit is inserted into the insertion portion of the connection check unit, the pressing unit may directly or indirectly apply pressure to the push switch to turn on the push switch.

This connection check step S111 may prevent the life span of the ESS of the present invention from being reduced.

If the ESS is continuously used in uninterruptible power supply mode with no normal power connected, a typical UPS is used to supply power to the maximum load regardless of whether it is overdischarged, so that the ESS may be overdischarged and the life of the ESS may be reduced due to the damage of the ESS. However, since the ESS of the present invention uses both the ESS mode and the uninterruptible power supply mode, the ESS should not be overdischarged to damage the ESS and reduce the service life of the ESS.

Therefore, if a connection check step is further included, in a case where the ESS is not connected to normal power, by allowing the ESS to be available only in ESS mode, it is possible to prevent the ESS from being overdischarged so that the damage of the ESS may be prevented and the service life of the ESS may be increased.

1-2. Operation Mode Setting Step S120

Meanwhile, the operation mode setting step S120 is a step of setting the operation mode of the ESS according to when the normal power is supplied or the normal power is not supplied in the normal power supply check step S110. More specifically, if it is determined that the normal power is supplied in the normal power supply check step S110, the ESS may be set to the ESS mode.

On the other hand, if it is determined that the normal power is not supplied in the normal power supply check step S110, the ESS may be set to the UPS mode.

Specifically, in relation to a method of setting the ESS to the UPS mode, by turning on the UPS discharge switch provided separately from the main discharge switch by which the ESS is discharged from the BMS of the ESS, the ESS may be set to the UPS mode. When the UPS discharge switch is turned on in such a manner, since the discharge to the load is generated through a path different from the discharging path when the ESS mode is used, the discharge to the load may be performed without performing the discharge diagnosis step of the ESS to be described later.

1-3. ESS Control Step S130

Meanwhile, the ESS control step S130 may perform a discharge diagnosis step if the ESS mode is maintained in the operation mode setting step S120.

1-3-1. Discharge Diagnosis Step S131

The discharge diagnosis step S131 may be a step of diagnosing whether the ESS is dischargeable based on the charging capacity, the temperature, and the discharge voltage of the ESS.

More specifically, in order for the ESS to prevent the overdischarge of the ESS from reducing or damaging the life of the ESS, the minimum charge capacity at discharge, the maximum/minimum temperature range at discharge, and the maximum discharge voltage at discharge are predetermined. At this time, the predetermined minimum charge capacity at discharge, maximum/minimum temperature range at discharge, and maximum discharge voltage at discharge may be set differently depending on the ESS specification.

Then, the discharge diagnosis step S131 may determine that the ESS is in a dischargeable state only when the predetermined minimum charge capacity at discharge, maximum/minimum temperature range at discharge, and maximum discharge voltage at discharge compares the current charge capacity, temperature, and discharge voltage and then, the current charge capacity, temperature, discharge voltage are above the predetermined minimum charge capacity at discharge, within the predetermined maximum/minimum temperature range at discharge, and is below the predetermined maximum discharge voltage at discharge, respectively.

Meanwhile, if it is determined that the ESS is in a dischargeable state in the discharge diagnosis step S131, the main discharge switch may be turned on at the BMS to discharge the ESS.

Meanwhile, if the UPS mode is set in the operation mode setting step S120, the discharge may be directly performed without performing the discharge diagnosis step S132.

At this time, a UPS discharge switch other than the main discharge switch may be turned on to discharge the ESS.

In other words, the UPS operation switch that bypasses the main discharge switch is turned on in the BMS without going through the discharge diagnosis step S131, so that it is possible to discharge the ESS without performing a discharge diagnosis step.

By supplying power to the load without performing the discharge diagnosis step in such a manner, even if it is less than the predetermined minimum charge capacity at discharge, and it is out of the maximum/minimum temperature range at discharge, and it exceeds the maximum discharge voltage at discharge at discharge, since discharging may be performed, it is possible to prevent the data of the load from being damaged or lost due to the power failure.

2. ESS Operable In UPS Mode According To Embodiment Of Present Invention

FIG. 2 is a block diagram illustrating an ESS operable in a UPS mode according to an embodiment of the present invention.

FIG. 3 is a view illustrating a circuit diagram of an ESS operable in a UPS mode according to an embodiment of the present invention.

Hereinafter, an ESS operable in a UPS mode according to an embodiment of the present invention will be described with reference to FIGS. 2 and 3.

2-1 Normal Power Supply Check Unit 100

First, the normal power supply check unit 100 may perform a normal power supply determination step of a method of switching an ESS to a UPS according to an embodiment of the present invention.

More specifically, since the ESS discharges only when the charging capacity, temperature, discharge voltage, etc. of the ESS satisfy a predetermined discharge criterion, when the predetermined discharge reference is not satisfied at the time of power failure, the load connected to the ESS may be cut off such that the data stored in the load may be lost or the load may be damaged. Therefore, in order to supply power to the load without interruption when a power failure occurs, the ESS is switched to a UPS mode.

On the other hand, if the UPS is continuously used even when power is not supplied (even when power is always supplied), since the UPS continues to charge to maintain full charge, the lifetime of the ESS may be shortened.

For the above reason, the ESS with both the ESS mode and the UPS mode is switched to the UPS mode and uses it only during power failure.

On the other hand, the normal power supply check unit 100 is configured including a voltage measurement module 110 for measuring a voltage applied from the normal power and a determination module 120 for determining whether the normal power is connected by comparing the voltage applied from the normal power with a predetermined reference voltage.

2-1-1. Voltage Measurement Module 110

Meanwhile, the voltage measurement module 110 of the present invention is a module for measuring a voltage supplied to the ESS from the normal power. The voltage measurement module may be mounted in the BMS and formed or may be manufactured as a separate module and mounted on the ESS.

Meanwhile, the voltage supplied to the ESS from the normal power measured by the voltage measurement module is transmitted to the determination module 120, which will be described later.

2-1-2. Determination Module 120

On the other hand, the determination module 120 may determine that the normal power is supplied when the voltage supplied from the normal power to the ESS is equal to or higher than the predetermined reference voltage, and determine the normal power supply is stopped when the voltage applied from the power is less than the predetermined reference voltage.

2-1-3. Connection Check Unit 130

Meanwhile, the normal power supply check unit 100 may further include a connection check unit 130 for checking whether the ESS and the output terminal of the normal power are physically connected.

Meanwhile, the output terminal of the normal power may be implemented as a plug or a cable.

2-1-3-1. Receiving Portion 131

The receiving portion is a configuration in which the output terminal of the normal power is inserted or connected. The ESS of the present invention receives normal power through the receiving portion.

2-1-3-2. Connection Check Switch 132

The connection check switch is a switch for checking whether an output terminal of normal power inserted into the receiving portion is inserted or connected.

The connection check switch may be implemented using a magnetic switch or a push switch, which will be described later.

2-1-3-2-1. Magnetic Switch 132-1

The magnetic switch is configured to perform an on or off operation when the magnetic body approaches a certain range or more.

FIG. 5 is a view illustrating that the magnetic switch is turned on when the output terminal of the normal power includes a magnetic body and the output terminal of the normal power is inserted into the receiving portion.

Referring to FIG. 5, in the magnetic switch of the present invention, when the output terminal of the normal power is inserted into the receiving portion, the magnetic body provided at the output terminal of the normal power approaches the magnetic switch more than a predetermined range. When the magnetic body provided at the output terminal of the normal power approaches the magnetic switch more than a predetermined range, the magnetic switch is turned on.

2-1-3-2-2. Push Switch 132-2

The push switch is configured to perform an on or off operation when a predetermined pressure or more is applied.

FIG. 6 is a view illustrating that the push switch is turned on when the output terminal of the normal power includes a pressing unit and the output terminal of the normal power is inserted into the pressing unit.

Referring to FIG. 6, in the push switch of the present invention, when the output terminal of the normal power is inserted into the receiving portion, the pressing unit provided at the output terminal of the normal power applies a predetermined pressure or more to the push switch.

When the pressing unit provided at the output terminal of the normal power applies a predetermined pressure to the push switch, the push switch is turned on.

Meanwhile, the connection check unit 110 described above may prevent the service life of the ESS from being reduced.

If the ESS is continuously used in uninterruptible power supply mode with no normal power connected, a typical UPS is used to supply power to the maximum load regardless of whether it is overdischarged, so that the ESS may be overdischarged and the life of the ESS may be reduced due to the damage of the ESS. However, since the ESS of the present invention uses both the ESS mode and the uninterruptible power supply mode, the ESS should not be overdischarged to damage the ESS and reduce the service life of the ESS.

Therefore, if the connection check unit 110 is further included, in a case where the ESS is not connected to normal power, by allowing the ESS to be available only in ESS mode, it is possible to prevent the ESS from being overdischarged so that the damage of the ESS may be prevented and the service life of the ESS may be increased.

2-2. BMS 200

The BMS may be configured including a mode setting module 210 for setting an operation mode of the ESS, and a discharge diagnosis module 220 for diagnosing whether the ESS is dischargeable when the ESS maintains the ESS mode.

2-2-1. Mode Setting Module 210

Meanwhile, the mode setting module 210 may maintain the setting of the ESS mode when the normal power check unit 100 determines that the normal power is supplied.

If the normal power supply check unit determines that the supply of normal power is stopped, the ESS mode may be switched to the UPS mode.

2-2-2. Discharge Diagnosis Module 220

The discharge diagnosis module 220 may diagnose whether the ESS is dischargeable based on the charging capacity, the temperature, and the discharge voltage of the ESS.

More specifically, in order for the ESS to prevent the overdischarge of the ESS from reducing or damaging the life of the ESS, the maximum/minimum charge capacity at discharge, the maximum/minimum temperature range at discharge, and the maximum/minimum discharge voltage at discharge are predetermined. At this time, the predetermined maximum/minimum charge capacity at discharge, maximum/minimum temperature range at discharge, and maximum/minimum discharge voltage at discharge may be set differently depending on the ESS specification.

Then, the discharge diagnosis module 220 may determine that the ESS is in a dischargeable state only when the predetermined maximum/minimum charge capacity at discharge, maximum/minimum temperature range at discharge, and maximum/minimum discharge voltage at discharge compares the current charge capacity, temperature, and discharge voltage and then, the current charge capacity, temperature, discharge voltage are values within the predetermined maximum/minimum charge capacity at discharge, maximum/minimum temperature range at discharge, and maximum/minimum discharge voltage at discharge.

2-3. Mode Switching Switch Unit 300

The mode switching switch unit 300 may be configured including a main discharge switch 310 that is turned on by receiving a discharge command from the BMS and discharges the ESS when the ESS is set to the ESS mode, and a UPS discharge switch 320 that is turned on by receiving the UPS operation mode command from the BMS and operates the ESS in the UPS mode.

More specifically, the UPS discharge switch is configured including a diode, and the main discharge switch and the UPS discharge switch may be connected in parallel.

Meanwhile, the mode switching switch unit 300 may further include a main charge switch 330 for controlling the charging of the ESS, and when the main charge switch 330 is further included, the main discharge switch 310, the UPS discharge switch 320, and the main charge switch 330 may be connected in parallel.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. A method for switching an energy storage system (ESS) to operate as an uninterruptible power supply (UPS) to a load, the method comprising:
a normal power supply determination step of determining whether normal power is supplied to the ESS from a normal power source;
an operation mode setting step of setting an operation mode of the ESS according to whether the normal power is supplied or not; and
an ESS control step of controlling the ESS according to the set operation mode,
wherein the operation mode setting step includes setting the ESS to:
an ESS mode if the normal power is determined to be supplied; and
a UPS mode if the normal power is determined not to be supplied,
wherein the ESS control step includes:
if the ESS is set to the ESS mode, performing a discharge diagnosis step of diagnosing whether the ESS is dischargeable based on a predetermined reference and then performing a discharge from the ESS to the load by turning on a main discharge switch disposed in a first discharging path of the ESS only if the ESS is diagnosed to be dischargeable; and
if the ESS is set to the UPS mode, performing the discharge from the ESS to the load directly by turning on a UPS discharge switch disposed in a second discharging path of the ESS without performing the discharge diagnosis step, and wherein the main discharge switch and the UPS discharge switch are connected to each other in parallel.

2. The method of claim 1, wherein:
the normal power supply determination step comprises:
an applied voltage measurement step of measuring a voltage applied from the normal power source; and
a measurement step of determining whether the normal power is supplied by comparing the voltage applied from the normal power source and a predetermined reference voltage; and
the measurement step comprises:
determining that the normal power is supplied if the voltage applied from the normal power source is equal to or higher than the predetermined reference voltage; and
determining that the supply of the normal power is stopped if the voltage supplied from the normal power source is lower than the predetermined reference voltage.

3. The method of claim 1, wherein the discharge diagnosis step includes:
measuring a charge capacity, a temperature, and a discharge voltage of the ESS; and
comparing the measured charge capacity, temperature, and discharge voltage of the ESS with the predetermined reference to check whether the ESS is dischargeable.

4. The method of claim 2, wherein:
the normal power supply determination step further comprises a connection check step of checking whether the ESS and the normal power source are physically connected; and
the connection check step includes:
determining that the normal power source and the ESS are physically connected if a normal power output terminal the normal power source is inserted into an insertion portion of a connection check circuit and a switch of the connection check circuit is on; and
determining that the normal power source and the ESS are not physically connected if the switch of the connection check circuit is off.

5. The method of claim 4, wherein, in the connection check step:
if the switch comprises a magnetic switch configured to be turned on by a magnetic body, the normal power output terminal comprises a magnetic body; and
if the normal power output terminal is inserted into the insertion portion of the ESS, the magnetic switch is turned on by the magnetic body provided at the normal power output terminal.

6. The method of claim 4, wherein, in the connection check step:
if the switch comprises a push switch configured to be turned on by pressure, the normal power output terminal comprises a pressing unit; and
if the normal power output terminal is inserted into the insertion portion of the ESS, the push switch is turned on by the pressing unit provided at the normal power output terminal.

7. An energy storage system (ESS) operable in an uninterruptible power supply (UPS) mode to supply power to a load, the ESS comprising:
- a normal power supply check circuit configured to determine whether a normal power from a normal power source is supplied to the ESS;
- a battery management system (BMS) configured to control an operation mode and charging/discharging of the ESS by outputting at least a discharge command and a UPS mode command; and
- a mode switching switch circuit configured to operate according to a control of the BMS, wherein the BMS comprises:
- a mode setting module configured to set the ESS to:
  - an ESS mode if the normal power supply check circuit determines that the normal power is supplied, and
  - a UPS mode if the normal power supply check circuit determines that the normal power is not supplied, and
- a discharge diagnosis module configured to diagnose whether the ESS is dischargeable based on a predetermined reference, only if the ESS is set to the ESS mode and not if the ESS is set to the UPS mode, and wherein the mode switching switch circuit comprises:
- a main discharge switch disposed in a first discharging path of the ESS and configured to be turned on by receiving a discharge command from the BMS to discharge the ESS if the ESS is set to the ESS mode and is determined to be dischargeable; and
- a UPS discharge switch disposed in a second discharging path of the ESS and configured to be turned on by receiving a UPS mode command from the BMS to discharge the ESS if the ESS is set to the UPS mode, the second discharging path of the ESS being connected in parallel with the first discharging path of the ESS.

8. The ESS of claim 7, wherein the normal power supply check circuit comprises:
- a voltage measurement module configured to measure a voltage applied from the normal power source; and
- a determination module configured to:
  - compare the voltage applied from the normal power source with a predetermined reference voltage to determine whether the normal power is supplied;
  - determine that the normal power is supplied if the voltage applied from the normal power source is equal to or higher than the predetermined reference voltage; and
  - determine that the supply of the normal power is stopped if the voltage applied from the normal power source is lower than the predetermined reference voltage.

9. The ESS of claim 7, wherein the discharge diagnosis module is further configured to:
- measure a charge capacity, a temperature, and a discharge voltage of the ESS; and
- compare the measured charge capacity, temperature, and discharge voltage with the predetermined reference to check whether the ESS is dischargeable.

10. The ESS of claim 7, wherein:
- the UPS discharge switch comprises a diode; and
- the main discharge switch and the UPS discharge switch are connected in parallel.

11. The ESS of claim 7, wherein the normal power supply check circuit comprises a connection check circuit configured to check whether the normal power source is physically connected to the ESS, the connection check circuit comprising:
- a receiving portion into which a normal power output terminal of the normal power source is configured to be inserted; and
- a switch configured to be turned on or off according to whether the normal power output terminal is inserted into the insertion portion.

12. The ESS of claim 11, wherein:
- the switch comprises a magnetic switch configured to be turned on by a magnetic body;
- the normal power output terminal comprises a magnetic body at a position corresponding to the magnetic switch; and
- if the normal power output terminal is connected to the insertion portion, the magnetic switch is configured to be turned on by the magnetic body of the normal power output terminal.

13. The ESS of claim 11, wherein:
- the switch comprises a push switch configured to be turned on by pressure;
- the normal power output terminal comprises a pressing unit configured to apply a pressure to a position corresponding to the push switch; and
- if the normal power output terminal is connected to the insertion portion, the push switch is configured to be turned on by the pressing unit of the normal power output terminal.

14. The method of claim 1, wherein the first discharging path and the second discharging path are connected to each other in parallel.

* * * * *